SEMICONDUCTOR DEVICES AND SYSTEMS

Filed April 18, 1955 2 Sheets-Sheet 1

INVENTOR.
Jacques I. Pankove
BY
J. L. Whittaker
ATTORNEY

Nov. 17, 1959 J. I. PANKOVE 2,913,676

SEMICONDUCTOR DEVICES AND SYSTEMS

Filed April 18, 1955 2 Sheets-Sheet 2

INVENTOR.
Jacques I. Pankove
BY J. L. Whittaker
ATTORNEY

United States Patent Office 2,913,676

Patented Nov. 17, 1959

2,913,676

SEMICONDUCTOR DEVICES AND SYSTEMS

Jacques I. Pankove, Princeton, N.J., assignor to Radio Corporation of America, a corporation of Delaware Application April 18, 1955, Serial No. 501,992

13 Claims. (Cl. 332—16)

This invention relates generally to improved semiconductor devices and methods, and particularly, to improved semiconductor devices having controllably variable charge carrier transit paths and transit times, and to improved methods and circuits in which transit paths and transit times of different magnitudes may be utilized.

A semiconductor device of the type embodying the principles of the invention is useful not only for operation at comparatively high frequencies but since the transit paths and transit time of charge carriers may be controllably varied, the device lends itself to different types of circuit applications than conventional semiconductor devices.

Conventional semiconductor devices known as transistors comprise, in general, a crystal of semiconductor material having a base electrode and rectifying emitter and collector electrodes. The emitter electrode injects packets of minority charge carriers in response to an input signal and these packets of carriers flow to the collector electrode. Generally, in such transistors which have emitter and collector electrodes of comparatively large area, these electrodes are disposed on opposite faces of a thin wafer of crystalline material. They are also coaxial and substantially parallel to each other. With this construction, if the charge carriers in a packet flowing from the emitter to the collector in response to an input signal follow different transit paths and have different transit times, the device is operating inefficiently. Thus, in a properly operating conventional transistor, most of the charge carriers in any one packet of carriers injected by the emitter in response to an input signal, follow similar lengths of transit paths to the collector and have substantially the same transit time. In addition, in such conventional devices which are properly constructed, it is not possible to controllably vary the charge carrier transit paths or transit times of a packet of charge carriers.

Accordingly, an important object of this invention is to provide a semiconductor device of new and novel construction.

Another object is to provide an improved semiconductor device having controllably variable charge carrier transit times and transit paths.

Still another object of the invention is to provide an improved semiconductor device having controllably variable charge carrier transit time and improved circuits in which it may be employed.

In general, the principles and objects of this invention are accomplished by the provision of a semiconductor crystal or body having at least two oppositely disposed surfaces which are positioned at an angle with respect to each other so that at one end of the surfaces, they are relatively widely spaced and have a comparatively thick portion of the crystal between them and at the opposite ends they are relatively closer together and have a comparatively thin portion of the crystal between them.

Large-area emitter and collector electrodes are provided on these surfaces and the operative areas of these electrodes are also angularly disposed with respect to each other. Thus, a plurality of potentially parallel straight line current paths are provided between the two electrodes with the paths being relatively short where corresponding portions of the electrodes are relatively close together and with the paths being relatively long where the electrodes are relatively far apart. One base electrode is provided on the thin portion of the crystal and another base electrode is provided on the thick portion of the crystal with the path between the base electrodes being substantially transverse to the path between the emitter and collector electrodes.

In operation of the device, current flow between the emitter and collector electrodes may be limited to substantially any desired portion of the crystal adjacent to one or the other base electrode present between the two surfaces whereby charge carrier transit paths of different lengths may be achieved ranging from short paths in the vicinity of the thin portion of the crystal to long paths, by comparison, in the vicinity of the thick portion of the crystal. Thus, if operation of the device is restricted to the portion of the crystal where the surfaces are close together then the device has an optimum high frequency response. On the other hand, if the operation is extended to include portions of the crystal where the two surfaces are comparatively widely spaced, then the transit paths are comparatively long and the frequency response characteristic is altered. In addition, if a modulating signal is applied between the two base electrodes, then the general area of the transit paths may be varied in accordance with the signal and a frequency modulated output signal is provided.

In one embodiment of the invention, auxiliary control of the charge carrier transit paths is achieved by providing regions adjacent to the two base electrodes which are of the same type of conductivity but of greater conductivity than the center portion of the crystal. The resulting potential energy distribution through the crystal between the base electrodes provides a focusing action on the current flow in the crystal and provides control of the transit paths and transit time. Bias voltages applied between the base electrodes may be employed to enhance the control effect.

The invention is described in greater detail by reference to the drawing wherein.

Similar elements are designated by similar reference characters throughout the drawing.

Figures 1, 2, 3, 4, 5, 6, 7, 8, 9:
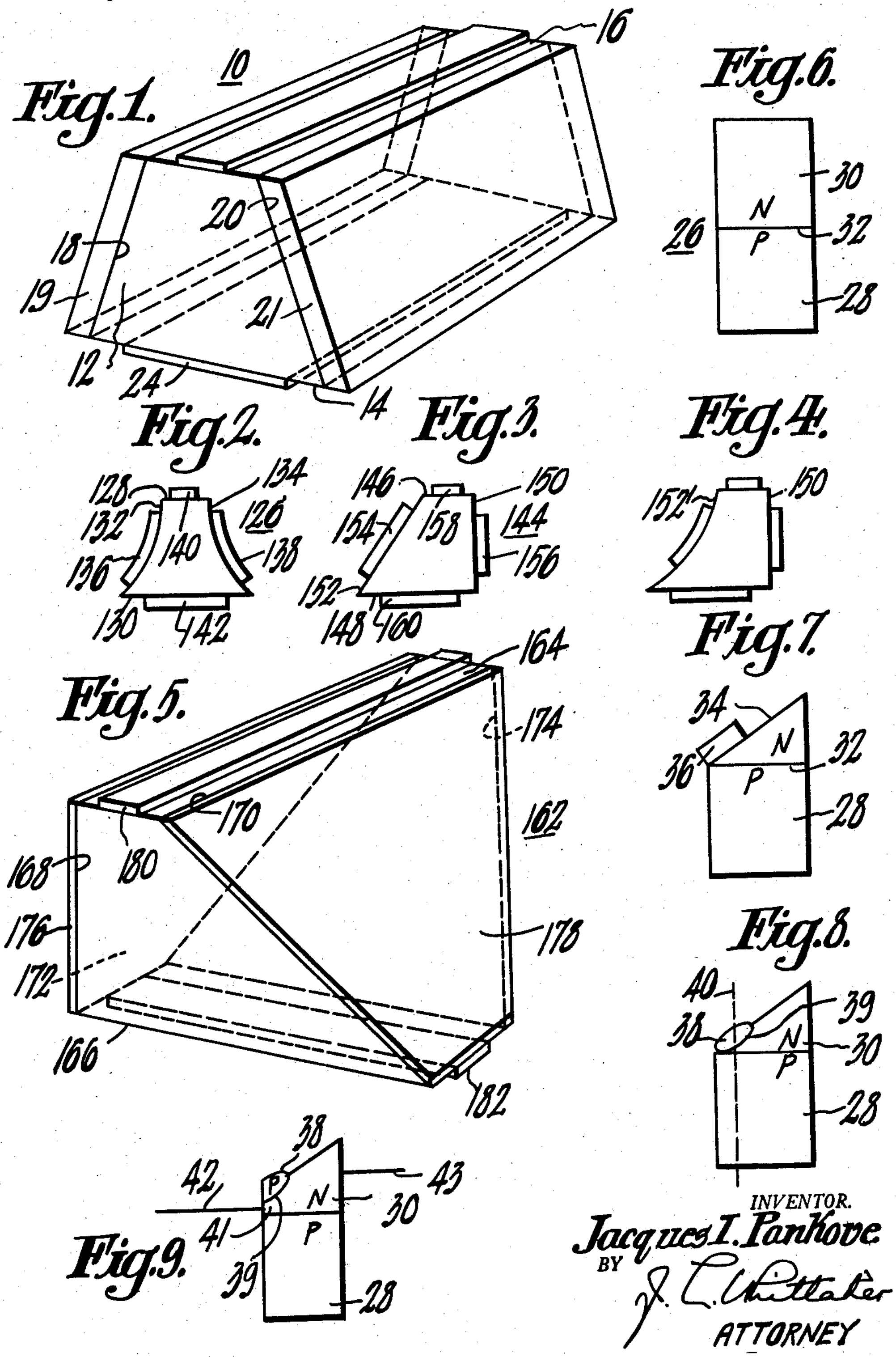
Fig. 1 is a transistor device embodying the principles of the invention.
Fig. 2 is an elevational view of one modification of the invention.
Fig. 3 is an elevational view of another modification of the invention.
Fig. 4 is an elevational view of still another modification of the invention.
Fig. 5 is a perspective view of another modification of the invention.
Fig. 6 is an elevational view of a semiconductor crystal employed in making a device embodying the principles of the invention according to one method.
Fig. 7 is an elevational view of the crystal of Fig. 6 at one stage in the process.
Fig. 8 is an elevational view of the crystal of Fig. 6 at another stage in the process.
Fig. 9 is an elevational view of the completed device prepared with the crystal of Fig. 6.

Referring to Figure 1, a semiconductor device 10 embodying the principles of the invention includes a body of semiconductor material, for example, germanium, silicon or the like of N-type or P-type conductivity. For the purposes of the present description, the body will be assumed to be N-type germanium. The semiconductor body is in the form of a truncated prism or pyramid and has two substantially plane parallel bases, a bottom base 14 and a top base 16 and two surfaces 18 and 20 which are disposed opposite each other and at an angle with respect to each other. Thus, in the vicinity of the base 14 of the body, the surfaces 18 and 20 have a thick portion of the crystal between them and are comparatively far apart and in the vicinity of the base 16 the surfaces having a thin portion of the crystal between them and are comparatively close together.

The body is provided with large-area emitter and collector electrodes 19 and 21 on the surfaces 18 and 20, respectively which may be surface barrier type electrodes in the form of plates or films or the like in contact with the surfaces or they may be P–N junction type electrodes. The effective operative areas of the emitter and collector electrodes are considerably larger than those of conventional catwhiskers and preferably cover a large area of the surfaces they contact. These areas are, preferably, substantially equal. The effective operative areas of the emitter and collector electrodes are defined as the areas between which current flows when the device is operated.

A first base electrode 22 in the form of a plate or the like is bonded in ohmic (non-rectifying) contact to the upper base 16 of the semiconductor body and a second base electrode 24 is bonded in ohmic contact to the lower base 14. The base electrodes also preferably have a comparatively large cross-sectional area in order to provide reduced base-lead resistance.

The device 10 shown in Figure 1 is operated with an electric field present in the semiconductor body 12 between the base electrodes 22 and 24. The operation of the device will be described in detail below, however, at this point, it is to be noted that the distribution of the electric field or its intensity at different regions in the body between the base electrodes depends on the cross-sectional area of the body at these regions. Thus, the device 10, has a certain characteristic electric field distribution determined by the varying cross section of the body, in planes taken parallel to the base electrodes, from the base electrode 22 to the base electrode 24.

The principles of the invention may be embodied in semiconductor devices having many different forms to provide different electric field distributions than that shown in Figure 1. For example, referring to Figure 2, a device 126 includes a semiconductor crystal having plane, parallel top and bottom base surfaces 128 and 130 of different cross-sectional areas and opposed side surfaces 132 and 134 which are curved concavely inward. Emitter and collector electrodes 136 and 138 are associated with the curved surfaces 132 and 134, respectively, and two base electrodes 140 and 142 are bonded to the top and bottom base surfaces 128 and 130, respectively.

Referring to Figure 3 in another embodiment of the invention, a device 144 includes a crystal having plane, parallel top and bottom base surfaces 146 and 148 of unequal area and one plane side surface 150 extending between the bases and perpendicular thereto and another side surface 152 extending between the base surfaces and disposed at an angle to the surface 150. Emitter and collector electrodes 154 and 156 are mounted in operative relation with the surfaces 150 and 152, respectively, and base electrodes 158 and 160 are mounted in operative relation with the base surfaces 146 and 148, respectively. If desired, the angularly disposed surface 152 may be a curved surface 152' as shown in Figure 4 rather than planar as in Figure 3.

In another embodiment of the invention, referring to Figure 5, a device 162 includes a semiconductor crystal having upper and lower plane, parallel base surfaces 164 and 166 which have substantially equal areas and side surfaces 168 and 170 which are disposed at an acute angle to each other as shown so that they are closely spaced adjacent to the upper base surface 164 and widely spaced adjacent to the lower base surface 166. The crystal also is provided with two end faces 172 and 174 which are disposed at an angle to each other so that they are comparatively widely spaced adjacent to the upper base surface 164 and comparatively closely spaced adjacent to the lower base surface 166. The side surfaces and end surfaces are thus sloped with respect to each other so that horizontal planes cut through the crystal at different distances between the top and bottom bases have substantially equal cross-sectional areas. Thus in a crystal of this configuration when a voltage is connected between the base electrodes in a manner and for a purpose to be described below, the electric field through the crystal between the base electrodes is substantially uniform. Emitter and collector electrodes 176 and 178 are associated with the sloped side surfaces 168 and 170 as shown or they may be associated with the sloped end surfaces. Base electrodes 180 and 182 are bonded to the upper and lower base surfaces, respectively.

The emitter and collector electrodes in the various embodiments of the invention may be prepared by suitably evaporating or plating on to the crystal surfaces rectifying films of metal. Alternatively, if the emitter and collector electrodes are P–N junction electrodes, they may be made according to an alloying or fusion process described by Law et al. in a paper entitled "A Developmental Germanium P–N–P Junction Transistor" in the November 1952 Proceedings of the IRE.

According to another method of preparing the semiconductor body and its rectifying emitter and collector electrodes, referring to Figures 6 and 7, a crystal 26 of semiconductor material having P-type and N-type conductivity regions 28 and 30, respectively, separated by a rectifying barrier 32 is prepared, for example, by a crystal growing process. One of the regions, for example the N-type region 30, is ground down at an angle to the barrier 30 to provide a surface 34 disposed at an angle to the barrier 32 and which may intersect the rectifying barrier at one end thereof. Employing the alloying procedure described in the above-identified paper and referring to Figures 7 and 8, a body of impurity material 36, for example indium, which covers a considerable portion of the area of the surface 34, is alloyed into the surface 34 of the N-type region 30 generally at the region where the surface 34 is closely adjacent to the rectifying barrier 32. A region 38 of P-type material is thus formed separated from the crystal by a rectifying barrier 39. Thus, the region 30 tapers in thickness between the P-type regions 28 and 38. Next, the entire crystal is sliced off along the dash line 40 so that, as shown in Figure 9, a portion 41 of the region of P-type material is exposed to allow connection thereto of a base electrode 42. The P-type region 38 may then be employed as the emitter electrode and the P-type region 28 as the collector electrode. Another ohmic base connection 43 is made to the N-type region 30 opposite the base connection 42.

Figure 10:
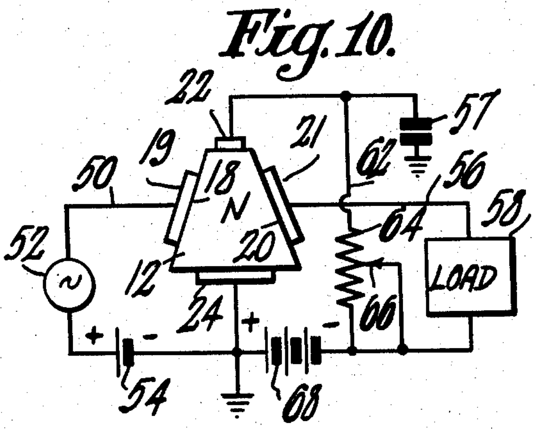
Fig. 10 is an elevational view of the device of Fig. 1 and a schematic representation of one circuit in which it may be operated.

The operation of the devices of the present invention may be more readily understood from a consideration of Figure 10 which includes the device 10 connected in one circuit in which it may be employed. The emitter electrode 19 is connected through a lead 50 to a signal source 52 and to the positive terminal of a battery 54, the negative terminal of which is connected to one of the base electrodes, for example, the electrode 24 and to a source of reference potential such as ground. The emitter electrode is thus biased in the forward direction with respect to the N-type semiconductor crystal 12. The collector electrode 21 is connected through a lead 56 to a suitable load circuit 58 and to the negative terminal of a battery 60 the positive terminal of which is connected to the base electrode 24. The collector electrode is thus biased in the reverse direction with respect to the semiconductor body. The base electrode 22 is connected by a lead 62 through a bias resistor 64 to the negative end of the bias battery 60. A sliding tap 66 on the resistor 64 is also coupled to the negative terminal of the battery 60. A by-pass capacitor 57 is connected from the base electrode 22 to ground.

In operation of the device and circuit of Figure 1, current flows between the emitter 19 and collector 21 under the control of the signal source 52 and an output signal appears in the load circuit 58 representative of the input signal from the source 52. In effect, the current flow, in the optimum condition, between corresponding points of the emitter and collector electrodes along substantially straight line paths parallel to the base surfaces 14 and 16. The setting of the tap 66 of the resistor 64 determines the region of current flow in the crystal 12 between the electrodes 22 and 24 and this current flow determines the maximum transit path length and the frequency response of the device 10.

The setting of the tap 66 of the resistor 64 establishes a certain voltage and field distribution in the semiconductor crystal between the base electrodes. This voltage distribution acts to oppose the bias on the emitter so that portions of the emitter beginning at electrode 24 and extending toward electrode 22 may be effectively cut off so that they do not inject charge carriers. The extent to which the emitter is cut off depends on the relative magnitudes of the emitter bias voltage and the base-to-base voltage. Thus, if the tap 66 is adjusted so that the base-to-base current has a high value, current injection may be limited to a small portion of the emitter adjacent to the base electrode 22 where the emitter-to-collector current paths are very short. With this arrangement, the high frequency response of the device is optimum. Similarly, by reducing the current flow between the bases by adjustment of the tap 66, the current transit paths may be lengthened and the frequency response of the device may be varied. Thus, in effect, a tone control type of operation may be achieved.

Figure 11:
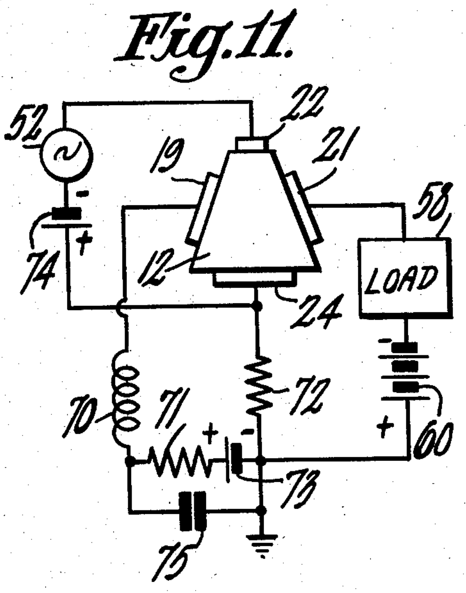
Fig. 11 is an elevational view of the device of Fig. 1 and a schematic representation of another circuit in which it may be operated.

Referring to Figure 11, the device 10 is shown employed in a frequency modulation type of circuit. In the circuit, the emitter electrode 19 is coupled through an inductance 70 and a bias resistor 71 to the positive terminal of a bias battery 73, the negative terminal of which is connected to a source of reference potential such as ground and the collector electrode 21 is coupled through the load circuit 58 to the negative terminal of the bias battery 60, the positive terminal of which is grounded. The base electrode 24 is coupled through a resistor 72 to ground and the base electrode 22 is connected through the signal source 52 to the negative terminal of a battery 74, the positive terminal of which is connected to the base electrode 24. A by-pass capacitor 75 is connected in parallel with the resistor 71 and battery 73.

The device 10 in the circuit of Figure 11 oscillates at a frequency determined by the value of the inductance 70 and the value of the capacitance $C_{b'e}$ between the emitter 19 and the base electrode 24. This capacitance parameter depends on the distance, that is, the transit path which the minority carriers travel between the emitter and the collector and, specifically, varies with the square of this distance, the D.C. emitter current being kept constant. An input signal from the source 52 applied between the two base electrodes 22 and 24 modulates the charge carrier transit path in the manner described above and, accordingly, modulates the frequency of oscillation of the device. Thus, a frequency modulated signal appears in the output circuit 58.

Figure 12:
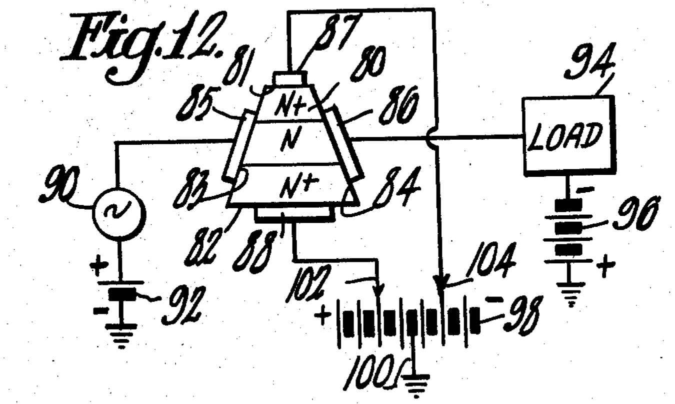
Fig. 12 is an elevational view of another form of device embodying the principles of the invention and a schematic representation of a circuit in which it may be operated; and, Fig. 13 includes curves representing potential energy profiles across the device shown in Fig. 12 between the base electrodes for different electrical bias conditions between these electrodes.

Referring to Figure 12, another modification of the invention suitable for achieving controllably variable time delay within a desired range in the charge carrier flow includes a crystal 80, for example of N-type germanium in the form of a wedge having parallel base surfaces 81 and 82 and sloped side surfaces 83 and 84. The crystal is provided with regions adjacent to the base surfaces of more highly N-type material designated N+. Each of these N+ regions, preferably, penetrates to the same depths within the crystal beneath the surfaces 81 and 82.

The N+ regions blend smoothly with the N-type portion of the crystal and they may be formed by a diffusion process whereby a suitable N-type conductivity determining impurity material, for example, antimony is diffused into the crystal adjacent to the base surfaces by heating at an elevated temperature of the order of 900° C. for several hours. Alternatively, these regions may be formed by first soldering ohmic contact base electrodes 87 and 88 to the two base surfaces 81 and 82, respectively by means fo a solder material which includes an N-type conductivity determining impurity material, for example, antimony. One suitable solder may comprise, for example, an alloy of 10 weight percent antimony in lead (the antimony being the conductivity determining material). The soldering process may be accomplished by heating at a temperature of 650° C. for a time of the order of 10 minutes. Then the crystal is heated at 950° C. for about one hour to achieve the desired diffusion of the antimony atoms and formation of the N+ regions. The crystal 80 is provided with emitter and collector electrodes 85 and 86 on the sloping surface 83 and 84, respectively.

In operation of the device shown in Figure 12, the emitter 85 is coupled to a signal source 90 and to the positive terminal of a battery 92, the negative terminal of which is connected to a source of reference potential such as ground. Thus the emitter electrode is biased in the forward direction with respect to the crystal 82. The collector electrode 86 is coupled to a suitable load circuit 94 and to the negative terminal of a battery 96, the positive terminal of which is grounded. Thus, the collector is biased in the reverse direction with respect to the crystal 82.

A power source such as a battery 98 is provided for applying a bias voltage between the base electrodes 87 and 88. The battery 98 has a center tap 100 connected to ground and a pair of sliding taps 102 and 104. The sliding taps are gang connected and adapted to move in synchronism in opposite directions from the center taps so that the effective ground potential remains substantially constant. The base electrodes 87 and 88 are connected one to each of the taps 102 and 104 depending on the desired orientation of the battery polarity.

Figure 13:
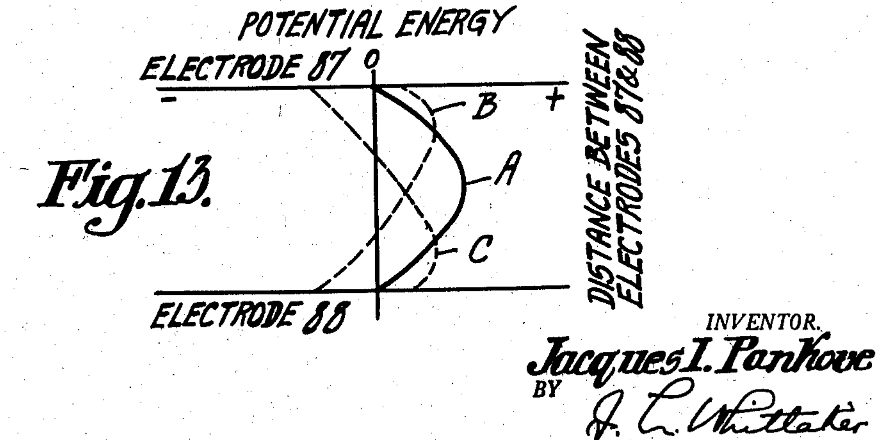

The potential energy profiles shown in Figure 13 for the crystal 80 include a curve A which represents the potential of the top of the valence band along the crystal between the electrodes 87 and 88 with no electrical bias voltage connected therebetween. The contour of the curve is determined by the impurity distribution in the crystal and is substantially smooth and symmetrical about a center maximum point if, as described, the thicknesses of the N+ regions are substantially equal and the impurity distribution varies uniformly between the N+ regions and the center N region of the crystal. With no bias voltage connected between the electrodes 87 and 88 the minority charge carriers injected by the emitter electrode 80 tend to flow toward the most negative point at the peak of the potential energy curve A and, accordingly, they follow a transit path equal approximately to the distance across the center of the crystal between the emitter and the collector electrodes. Curve B in Figure 13 represents a similar energy profile when a bias voltage is applied as shown between the electrodes 87 and 88 with the electrode 87 more negative than the electrode 88. The bias voltage shifts the peak of the energy curve toward the electrode 87 and, accordingly, the injected charge carriers follow a path toward the peak of this curve. Since the peak is moved toward the electrode 87 then the transit path and transit time are shorter than with no bias applied. If the bias voltage polarity is reversed between the electrodes 87 and 88 then the curve C in Figure 13 represents the potential energy distribution and the peak of the energy curve is displaced toward the electrode 88. Thus, the charge carrier transit path is displaced toward the electrode 88 and the transit path and transit time are longer than the conditions for curve A and curve B.

If desired, a signal source may be connected between the base electrodes 87 and 88 to provide frequency modulation of the current flow through the body 82 by changing the charge carrier transit paths and transit times in response to the signal.

What is claimed is:

1. A semiconductor device comprising a body of semiconductor material, an emitter electrode and a collector electrode in rectifying contact with said body and angularly disposed with respect to one another, said rectifying electrodes disposed to provide substantially parallel straight line current flow paths of different lengths between them through said body, and a pair of non-rectifying base electrodes defining the terminals of an auxiliary current flow path disposed substantially transversely of said straight line paths.

2. A semiconductor device comprising a body of semiconductor material, a pair of rectifying electrodes in rectifying contact with said body and angularly disposed with respect to one another, said rectifying electrodes defining the terminals of substantially parallel, straight-line current flow paths of different lengths in said body and a pair of non-rectifying electrodes defining the terminals of an auxiliary current flow path disposed substantially tranversely of said straight-line paths.

3. A semiconductor device comprising a body of semiconductor material, a pair of large-area electrodes in rectifying contact with said body, the effective operative areas of said electrodes being angularly disposed with respect to each other such that corresponding portions of said areas are at different substantially straight-line distances from each other, said straight-line distances comprising current paths between said electrodes, and means for controlling the operative area of one of said electrodes and thereby controlling the maximum length of the current paths between said electrodes, said means comprising a pair of electrodes in nonrectifying contact with said body and disposed in a path transverse to the path between said rectifying electrodes.

4. A semiconductor device consisting essentially of a body of semi-conductor material, a pair of large-area electrodes in rectifying contact with said body, the effective operative areas of said electrodes being angularly disposed with respect to each other such that corresponding portions of said areas are at different substantially straight-line distances from each other, said straight-line distances comprising current paths between said electrodes, and non-rectifying means defining the terminals of a current flow path substantially transverse to the current paths between said electrodes.

5. A semiconductor device comprising a body of semiconductor material, a pair of large-area electrodes in rectifying contact with said body, the effective operative areas of said electrodes being angularly disposed with respect to each other such that corresponding portions of said areas are at different substantially straight-line distances from each other, said straight-line distances comprising current paths between said electrodes, and a pair of non-rectifying electrodes defining the terminals of a current flow path substantially transverse to the current paths between said electrodes.

6. A semiconductor device comprising a body of semiconductor material having a pair of surfaces angularly disposed with respect to each other, a large-area rectifying electrode in contact with each of said surfaces, said electrodes being similarly angularly disposed and defining the terminals of a plurality of substantially straight line current flow paths of different lengths in said body, and non-rectifying means defining the terminals of an auxiliary current flow path disposed transversely of said plurality of current flow paths.

7. The device defined in claim 6 wherein said means comprises a pair of non-rectifying electrodes.

8. The device defined in claim 6 wherein each of said surfaces is planar.

9. The device defined in claim 6 wherein one of said surfaces is curved and one is planar.

10. A semiconductor device comprising a body of semiconductor material having a first pair of substantially plane parallel base surfaces, a second pair of surfaces angularly disposed with respect to each other, one surface of said second pair being perpendicular to said first pair of surfaces and the other surface of said second pair being disposed at an angle to said first pair of surfaces, a rectifying electrode in contact with each of said second pair of surfaces and defining the terminals of a first current flow path therebetween, and another pair of electrodes in contact with said first pair of surfaces and defining the terminals of another current flow path disposed transversely to said first current flow path.

11. A semiconductor device comprising a body of semiconductor material having large-area emitter and collector rectifying electrodes in contact therewith, the areas of contact of said electrodes being substantially planar and being angularly disposed with respect to each other, and a pair of non-rectifying electrodes aligned substantially transversely of the path between said rectifying electrodes.

12. A semiconductor device comprising a semiconductor body including a central region of material of one type of conductivity and regions on either side of said central region of the same type of conductivity but a greater magnitude of conductivity, emitter and collector electrodes in rectifying contact with said body and means for establishing a transverse field in said body between said rectifying electrodes, said means comprising a pair of electrodes in nonrectifying contact with said body and disposed in a path transverse to the path between said rectifying electrodes.

13. A semiconductor device comprising a semiconductor body including a central region of material of one type of conductivity and regions on either side of said central region of the same type of conductivity but a greater magnitude of conductivity, said body having two surfaces angularly disposed with respect to each other, emitter and collector electrodes in rectifying contact with said surfaces and means for establishing a transverse field in said body between said rectifying electrodes, said means comprising a pair of electrodes in nonrectifying contact with said body and disposed in a path transverse to the path between said rectifying electrodes.

References Cited in the file of this patent

UNITED STATES PATENTS

| | | |
|---|---|---|
| 2,569,347 | Shockley | Sept. 25, 1951 |
| 2,600,500 | Haynes | June 17, 1952 |
| 2,666,814 | Shockley | Jan. 19, 1954 |
| 2,764,642 | Shockley | Sept. 25, 1956 |
| 2,790,037 | Shockley | Apr. 23, 1957 |